(12) United States Patent
Li et al.

(10) Patent No.: US 12,412,609 B2
(45) Date of Patent: Sep. 9, 2025

(54) METHOD OF REDUCING PROGRAM DISTURBANCE IN MEMORY DEVICE AND MEMORY DEVICE UTILIZING SAME

(71) Applicant: YANGTZE MEMORY TECHNOLOGIES CO., LTD., Wuhan (CN)

(72) Inventors: Shan Li, Wuhan (CN); Kaikai You, Wuhan (CN); Ying Cui, Wuhan (CN); Jianquan Jia, Wuhan (CN); Kaiwei Li, Wuhan (CN); An Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 240 days.

(21) Appl. No.: 18/139,316

(22) Filed: Apr. 25, 2023

(65) Prior Publication Data

US 2023/0260560 A1    Aug. 17, 2023

Related U.S. Application Data

(63) Continuation-in-part of application No. 17/539,133, filed on Nov. 30, 2021, now Pat. No. 11,676,646, which is a continuation of application No. 16/740,491, filed on Jan. 13, 2020, now Pat. No. 11,222,674, which is a continuation of application No. PCT/CN2019/123942, filed on Dec. 9, 2019.

(51) Int. Cl.
*G11C 16/00* (2006.01)
*G11C 7/14* (2006.01)
(Continued)

(52) U.S. Cl.
CPC ............... *G11C 8/08* (2013.01); *G11C 7/14* (2013.01); *G11C 8/14* (2013.01); *G11C 11/4074* (2013.01);
(Continued)

(58) Field of Classification Search
CPC .... G11C 8/08; G11C 7/14; G11C 8/14; G11C 16/0483; G11C 16/06; G11C 16/10; G11C 16/30
See application file for complete search history.

(56) References Cited

U.S. PATENT DOCUMENTS 7,471,566 B2    12/2008    Hemink
9,460,805 B1    10/2016    Pang
(Continued)

FOREIGN PATENT DOCUMENTS

CN    1777960 A    5/2006
CN    101079321 A    11/2007
(Continued)

*Primary Examiner* — Mushfique Siddique
(74) *Attorney, Agent, or Firm* — BAYES PLLC

(57) ABSTRACT

In some aspects, a memory device is provided. The memory device includes a plurality of memory strings and a peripheral circuit. One of the memory strings includes memory cells, a select transistor coupled to a select line and a bit line, and a dummy cell coupled to a dummy word line and arranged between the select transistor and the memory cells. The peripheral circuit is coupled to the memory strings and configured to, in a pre-pulse period of a program operation, maintain a first voltage on the select line to retain an on-state of the select transistor and apply a second voltage to the dummy word line to turn off the dummy cell. After applying the second voltage to the dummy word line, the peripheral circuit is further configured to apply a third voltage to the select line to turn off the select transistor.

20 Claims, 16 Drawing Sheets

(51) Int. Cl.
*G11C 8/08* (2006.01)
*G11C 8/14* (2006.01)
*G11C 11/4074* (2006.01)
*G11C 11/4094* (2006.01)
*G11C 16/04* (2006.01)
*G11C 16/06* (2006.01)
*G11C 16/10* (2006.01)
*G11C 16/30* (2006.01)

(52) U.S. Cl.
CPC ...... *G11C 11/4094* (2013.01); *G11C 16/0425* (2013.01); *G11C 16/0466* (2013.01); *G11C 16/0483* (2013.01); *G11C 16/06* (2013.01); *G11C 16/10* (2013.01); *G11C 16/30* (2013.01)

(56) References Cited

U.S. PATENT DOCUMENTS

| | | |
|---|---|---|
| 9,887,002 B1 | 2/2018 | Zhang et al. |
| 10,559,368 B1 | 2/2020 | Yang |
| 2010/0097862 A1* | 4/2010 | Kang ............... H10B 41/30 365/185.17 |
| 2010/0157686 A1 | 6/2010 | Lue |
| 2011/0116311 A1 | 5/2011 | Torsi |
| 2012/0307561 A1 | 12/2012 | Joo et al. |
| 2014/0301146 A1 | 10/2014 | Kaza |
| 2019/0108883 A1 | 4/2019 | Yu |
| 2019/0156901 A1 | 5/2019 | Chen |
| 2019/0189218 A1 | 6/2019 | Izumi et al. |
| 2019/0279726 A1 | 9/2019 | Li et al. |
| 2020/0006379 A1* | 1/2020 | Nishikawa ......... G11C 16/0483 |
| 2020/0168276 A1 | 5/2020 | Yang |
| 2021/0118484 A1 | 4/2021 | Jia et al. |
| 2021/0193237 A1 | 6/2021 | Song et al. |
| 2022/0215888 A1* | 7/2022 | Song ..................... G11C 16/24 |

FOREIGN PATENT DOCUMENTS

| | | |
|---|---|---|
| CN | 101556827 A | 10/2009 |
| CN | 105280224 A | 1/2016 |
| WO | 2014/210424 A2 | 12/2014 |

* cited by examiner

700

702 — In a pre-pulse period of a program operation, apply a first voltage to a top select line to turn on a corresponding top select cell in a memory string and apply a second voltage to a top dummy word line to turn on a corresponding top dummy cell in this memory string 704 — Apply a third voltage to the top dummy word line to turn off the top dummy cell while the top select cell is on 706 — Apply a fourth voltage to the top select line to turn off the top select cell 708 — Apply a fifth voltage to a bit line coupled to this memory string 710 — In a program period of the program operation, apply one or more programming pulses to a selected word line and a pass voltage to unselected word lines

FIG. 7

METHOD OF REDUCING PROGRAM DISTURBANCE IN MEMORY DEVICE AND MEMORY DEVICE UTILIZING SAME

CROSS-REFERENCE TO RELATED APPLICATIONS

This application is a continuation-in-part of U.S. application Ser. No. 17/539,133, filed on Nov. 30, 2021, entitled "METHOD OF REDUCING PROGRAM DISTURBANCE IN MEMORY DEVICE AND MEMORY DEVICE UTILIZING SAME," which is a continuation of U.S. application Ser. No. 16/740,491, filed on Jan. 13, 2020, entitled "METHOD OF REDUCING PROGRAM DISTURBANCE IN MEMORY DEVICE AND MEMORY DEVICE UTILIZING SAME," which is a continuation of International Application No. PCT/CN2019/123942, filed on Dec. 9, 2019, all of which are incorporated herein by reference in their entireties.

BACKGROUND

The present disclosure relates to non-volatile memory, and in particular, to a method of reducing program disturbance in a memory device and the memory device utilizing the same.

Non-volatile memory has been used extensively in personal computers, telecommunications, consumer electronics and other fields. Electrically erasable programmable read-only memory (EEPROM) and flash memory are among the most widely employed non-volatile memory.

As semiconductor devices continue to scale down, the degree of integration of non-volatile memory has increased, thereby enhancing device performance and price competitiveness. However, the increasing degree of integration also aggravates undesired coupling and interference between memory cells in the non-volatile memory during programming, reducing data reliability. Interference occurs when it is desired to program one selected memory cell on a selected word line without programming other cells on the same word line and on other word lines. When a voltage is applied to the selected word line, the voltage is applied not only to the selected cell but also to other cells unselected for programming along the same word line. The unselected cells on the selected word line, especially cells adjacent to the selected cell, may become inadvertently programmed. The unintentional programming of an unselected cell is referred to as "program disturbance."

SUMMARY

In some aspects, a memory device is provided. The memory device may include a plurality of memory strings and a peripheral circuit. One of the memory strings may include memory cells, a select transistor coupled to a select line and a bit line, and a dummy cell coupled to a dummy word line and arranged between the select transistor and the memory cells. The peripheral circuit may be coupled to the memory strings and configured to, in a pre-pulse period of a program operation, maintain a first voltage on the select line to retain an on-state of the select transistor and apply a second voltage to the dummy word line to turn off the dummy cell. After applying the second voltage to the dummy word line, the peripheral circuit may be configured to apply a third voltage to the select line to turn off the select transistor.

In other aspects, another memory device is provided. The memory device may include a plurality of memory strings and a peripheral circuit. One of the memory strings may include memory cells, a select transistor coupled to a bit line and a select line, and a dummy cell coupled to a dummy word line and arranged between the select transistor and the memory cells. The peripheral circuit may be coupled to the memory strings and configured to, before programming a target memory cell of the memory cells, apply a first voltage to the select line to turn on the select transistor, and a second voltage to the dummy word line to turn on the dummy cell; and after applying a third voltage to the dummy word line to turn off the dummy cell, apply a fourth voltage to the select line to turn off the select transistor. The third voltage may be lower than the second voltage. The fourth voltage may be lower than the first voltage.

In still other aspects, a method of operating a memory device is provided. The memory device may include a plurality of memory strings. One of the memory strings may include memory cells, a select transistor coupled to a bit line and a select line, and a dummy cell coupled to a dummy word line and arranged between the select transistor and the memory cells. The method may include applying a first voltage to the select line to turn on the select transistor, and a second voltage to the dummy word line to turn on the dummy cell; and after applying a third voltage to the dummy word line to turn off the dummy cell, applying a fourth voltage to the select line to turn off the select transistor. The third voltage may be lower than the second voltage, and the fourth voltage may be lower than the first voltage.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIG. 7 illustrates a flow chart of an example method of programming a memory device, according to some aspects of the present disclosure.

Figure 1:
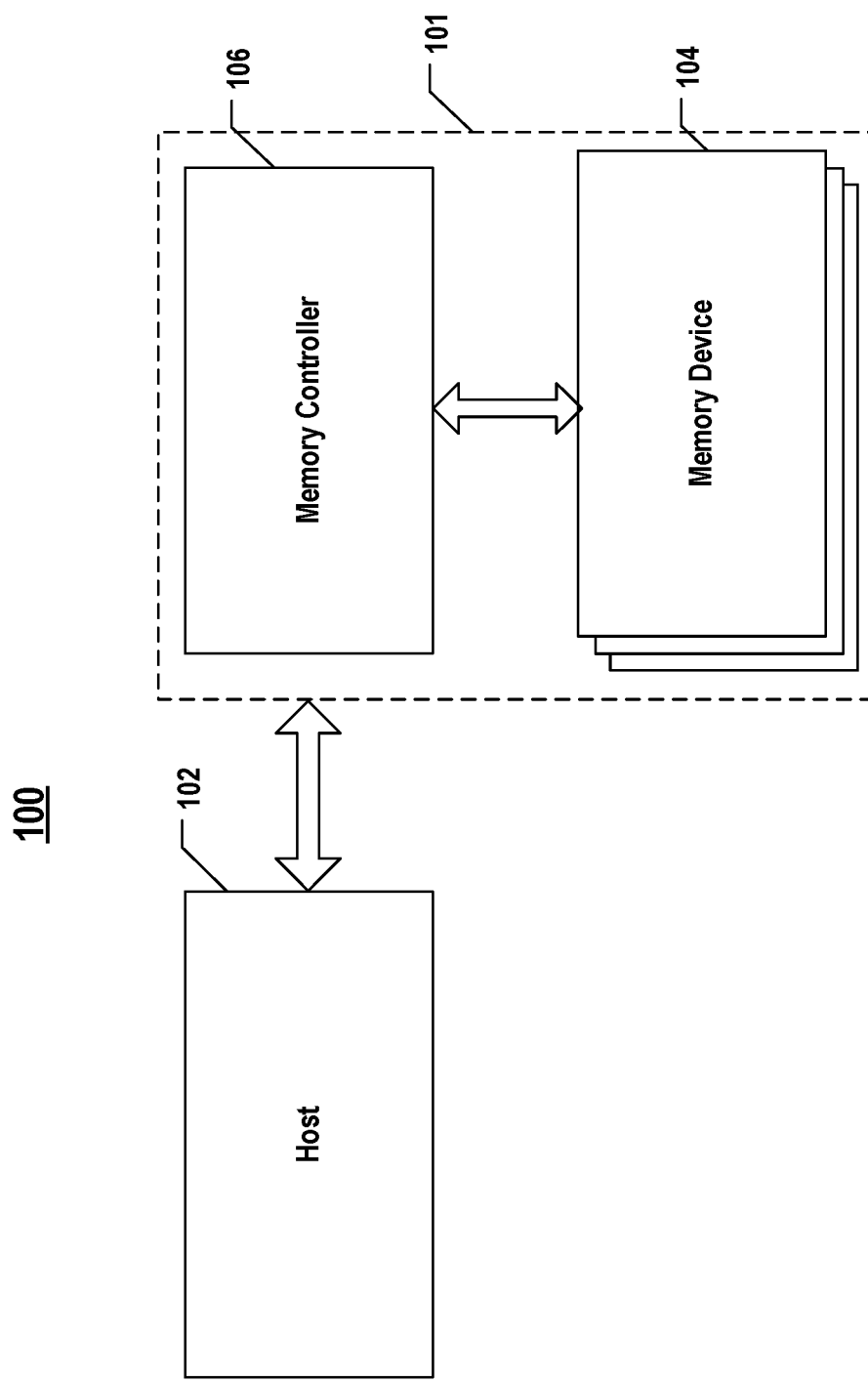
FIG. 1 illustrates a block diagram of an example system having a host and a memory system, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

It will be understood that the ordinal numbers "first", "second", "third" herein are used to distinguish various elements, components, regions, layers and/or sections, and these elements, components, regions, layers and/or sections should not be limited by the ordinal numbers. Position relative terms, such as "top" and "bottom" and the like, may be used herein to distinguish various elements, components, regions, layers and/or sections, and should not be used to limit the positions of the elements, components, regions, layers and/or sections.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intermediate elements or layers present.

Although embodiments of the present disclosure will be described with reference to NAND flash memory devices, it will be understood that embodiments of the present disclosure are not limited thereto to this configuration. For example, the present disclosure may be applied to nonvolatile memory devices, such as an Electrically Erasable and Programmable ROM (EEPROM), a NOR flash memory, a Phase-change RAM (PRAM), a Magnetic RAM (MRAM), a Resistive RAM (RRAM), a Ferroelectric RAM (FRAM), and the like, without departing from the scope of the present disclosure.

In order to increase the memory capacity, the memory density is increased, thus allowing more memory cells to be packed into a given physical space. However, increasing memory density can also come with some tradeoffs, such as increasing the likelihood of interference between adjacent memory cells.

Program disturbance is a phenomenon that can occur in planar memory devices or three-dimensional (3D) memory devices when programming of one memory cell affects the state of neighboring memory cells or vice versa. In a memory device, adjacent memory cells in a memory device can be coupled through various mechanisms, such as capacitive coupling, conductive coupling, or electromagnetic coupling. When a voltage is applied to a word line to program a target memory cell, this voltage can induce a charge in the adjacent memory cells through these coupling mechanisms. This induced charge can potentially modify the stored charge of the neighboring cells, leading to program disturbance.

Overall, program disturbance can have negative effects on the performance and reliability of a memory device. It can lead to errors in data storage and retrieval, reduce the lifespan of the memory device, and increase the risk of data corruption or loss. Therefore, it is important to find a solution to reduce program disturbance.

To address one or more of the aforementioned issues, the present disclosure introduces several voltage schemes that can be applied to a memory device. In these voltage schemes, different voltages may be applied to various electrical lines of the memory device such that no electron or a very limited number of electrons will return to memory cells in a memory device during a program operation.

Figure 3:
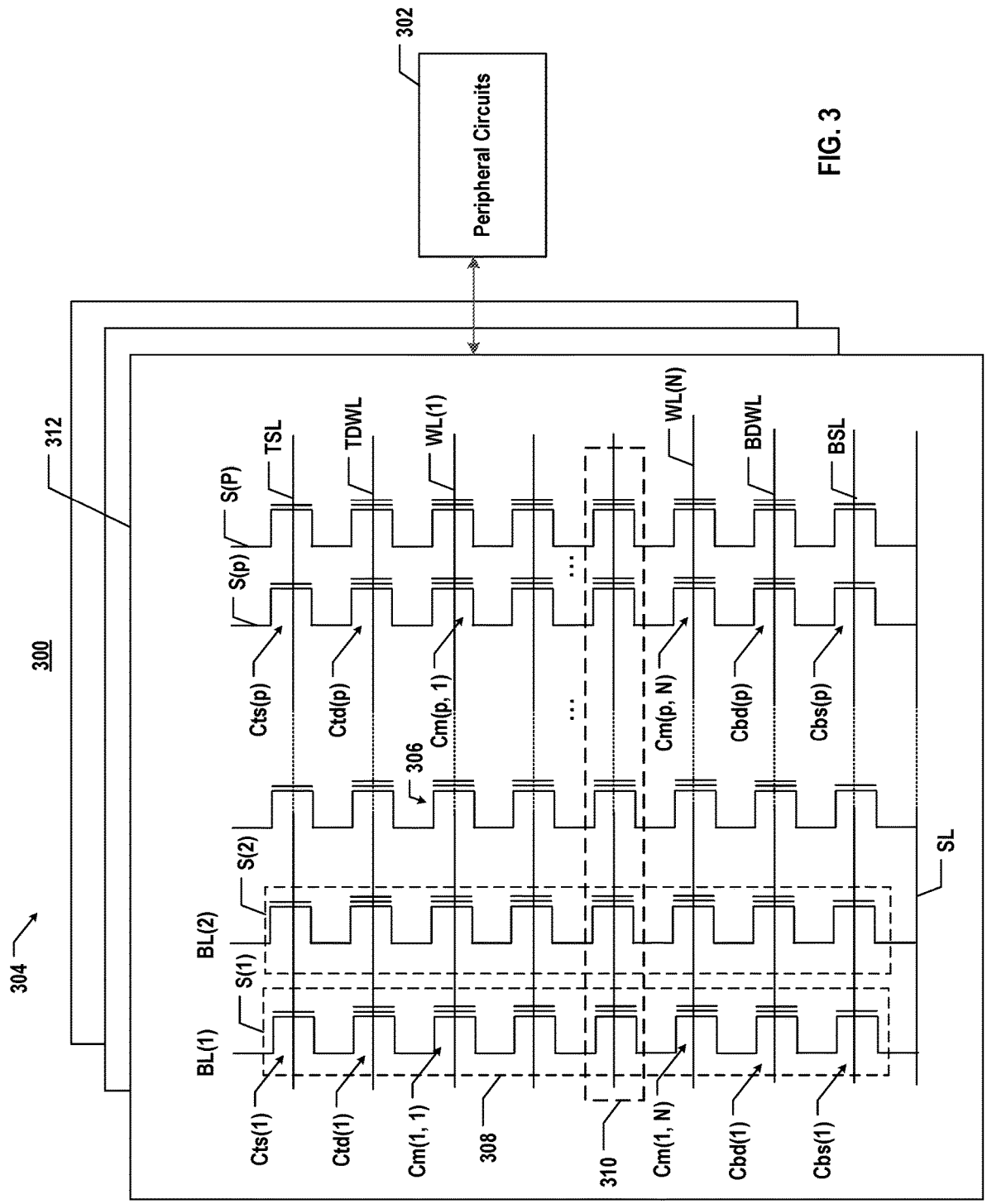
FIG. 3 illustrates a schematic diagram of an example memory device, according to some aspects of the present disclosure.

FIG. 3 illustrates a schematic diagram of an example memory device 300, according to some aspects of the present disclosure. Memory device 300 may include peripheral circuits 302 and a memory cell array 304 coupled to peripheral circuits 302. In some implementations, as shown in FIG. 3, memory device 300 may be a 3D NAND memory device, and memory cell array 304 may be a NAND memory cell array in which memory cells 306 may be provided in the form of an array of NAND memory strings 308 each extending vertically above a substrate (not shown). In some implementations, each NAND memory string 308 may include a plurality of memory cells 306 coupled in series and stacked vertically. As shown in FIG. 3, each of NAND memory strings 308 may be numbered as memory string S(1), memory string S(2) . . . , and memory string S(P), respectively. In some examples, parameter P can include a positive integer.

In some implementations, memory cells 306 can be coupled through word lines WL(1) to WL(N) that select which row of these memory cells is affected by the read and program operations. In some examples, N may include a positive integer. These memory cells may also be termed as "main memory cells," and it can be understood that the terms "memory cells" and "main memory cells" may be used interchangeably to identify memory cells coupled to word lines WL(1) to WL(N).

Each memory cell 306 can hold a continuous, analog value, such as an electrical voltage or charge, which depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 coupled to a word line WL can include a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 coupled to a word line WL can include a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

In some implementations, each NAND memory string 308 can include a top select transistor (e.g., Cts(1)) at its drain end and a bottom select transistor (e.g., Cbs(1)) at its source end. Therefore, top select transistor may be also termed as "drain select transistor," and bottom select transistor may be termed as "source select transistor," instead. Top select transistor Cts and bottom select transistor Cbs can be configured to activate a selected NAND memory string 308 (a column of the memory array) during the read and program operations. In some implementations, NAND memory strings 308 can be organized into multiple blocks 312, such as block 1, block 2, . . . , block m, where parameter m can include a positive integer. The sources of memory cells in NAND memory strings 308 of the same block 312 may be coupled through the same source line SL, e.g., a common SL. In other words, all NAND memory strings 308 in the same block 312 may have an array common source (ACS), according to some implementations. In some implementations, each block 312 may be the basic data unit for erase operations, i.e., all memory cells 306 on the same block 312 can be erased at the same time.

In some implementations, as shown in FIG. 3, the drain of top select transistor Cts of each NAND memory string 308 can be coupled to a respective bit line (e.g., BL(1) to BL(P)) from which data can be read or written via an output bus (not shown), according to some implementations. In some implementations, the gate of top select transistor Cts may be coupled to a top select line TSL (or termed "drain select line"), and the gate of bottom select transistor Cbs may be coupled to a bottom select line BSL (or termed "source select line"). In some implementations, each NAND memory string 308 can be configured to be selected or deselected by applying a select voltage (e.g., above the threshold voltage of top select transistor Cts) or a deselect voltage (e.g., 0 V) to the gate of a respective top select transistor Cts through one or more top select lines TSL and/or by applying a select voltage (e.g., above the threshold voltage of bottom select transistor Cbs) or a deselect voltage (e.g., 0 V) to the gate of a respective bottom select transistor Cbs through one or more bottom select lines BSL.

In some implementations, each NAND memory string 308 may include a top dummy cell (e.g., Ctd(1)) that is connected to the source of top select transistor (e.g., Cts(1)) and a bottom dummy cell (e.g., Cbd(1)) that is connected to the drain of bottom select transistor (e.g., Cbs(1)). Similarly, the terms "top dummy cell" and "drain dummy cell" may be used interchangeably, and the terms "bottom dummy cell" and "source dummy cell" may be used interchangeably. In some implementations, the gate of top dummy cell Ctd may be coupled to a top dummy word line TDWL (or termed "drain dummy word line"), and the gate of bottom dummy cell Cbd may be coupled to a bottom dummy word line BDWL (or termed "source dummy word line").

Dummy transistors, also known as dummy memory cells, can be inserted into a memory device to improve the performance and reliability of the memory device. More specifically, dummy cells may function as a buffer, and the presence of dummy cells can absorb the disturbance that may otherwise affect the data stored in the main memory cells, therefore enhancing the data retention characteristics of a memory device. The gate of top dummy cell Ctd may be coupled to a top dummy word line TDWL, and the gate of bottom dummy cell Cod may be coupled to a bottom dummy word line BDWL.

It can be understood that, although FIG. 3 shows only one top select transistor Cts, one top dummy cell Ctd, one bottom select transistor Cbs, and one bottom dummy cell Cbd at two sides of each NAND memory string 308, in some implementations, each NAND memory string 308 may include multiple top select transistors, multiple top dummy cells, multiple bottom select transistors, and multiple bottom dummy cells. On the other hand, in some implementations, some of these memory cells may be omitted. For example, in some examples, each NAND memory string in a memory device may not include a bottom dummy cell. In some implementations, each of top select transistor Cts, top dummy cell Ctd, bottom select transistor Cbs, and bottom dummy cell Cbd at two sides of each NAND memory string 308 may function as a switch in a corresponding NAND memory string 308. In some implementations, each of these transistors may include a charge storage layer, similar/same to that in a main memory cell configured to store charges.

Figure 4:
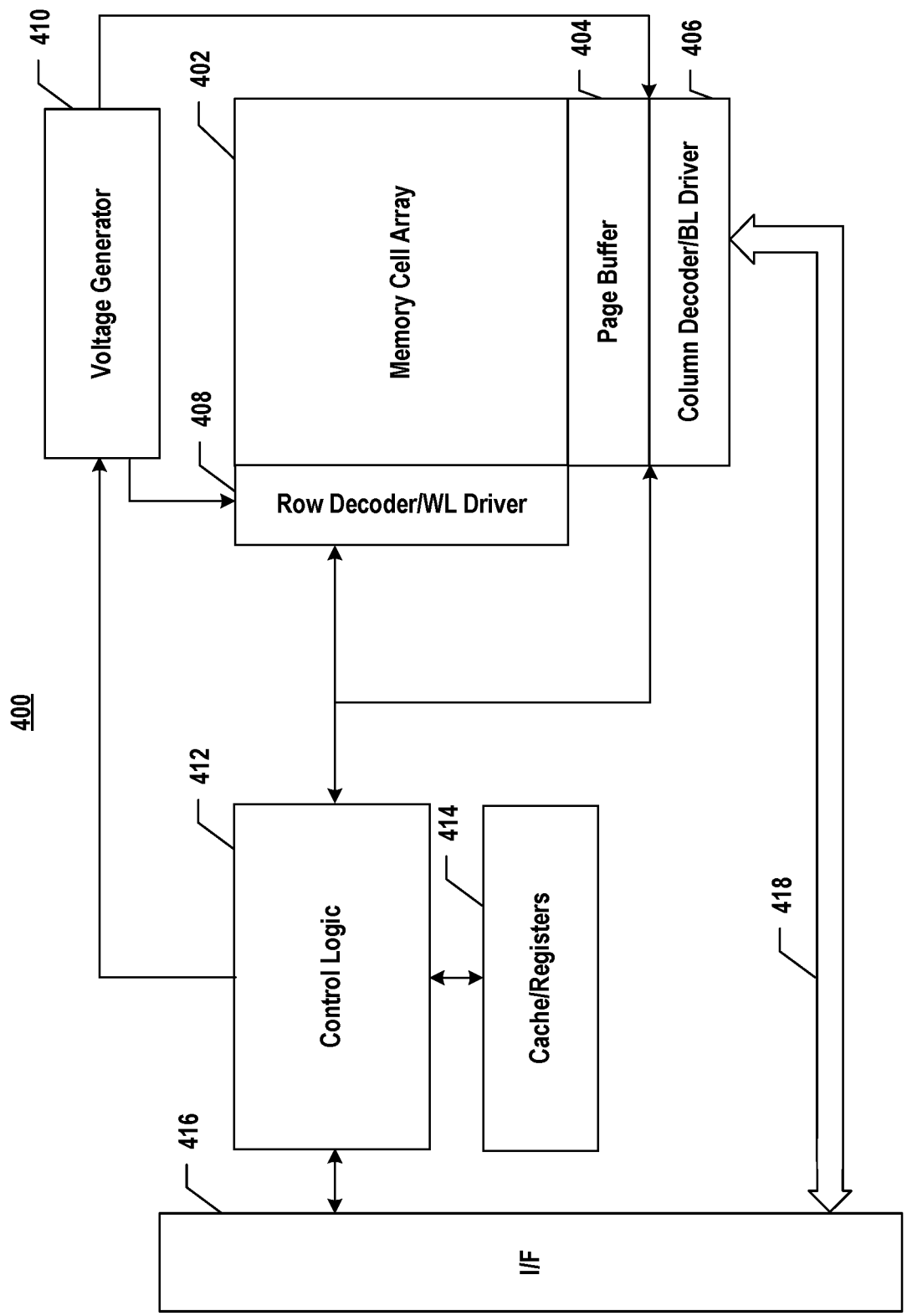
FIG. 4 illustrates a block diagram of an example memory device including a memory cell array and peripheral circuits, according to some aspects of the present disclosure.

FIG. 4 illustrates a block diagram of an example memory device 400 including a memory cell array 402 and peripheral circuits, according to some aspects of the present disclosure. Memory cell array 304 in FIG. 3 can be an example of memory cell array 402 in FIG. 4, while FIG. 4 may depict some examples of peripheral circuits 302 in FIG. 3.

Returning to FIG. 3, peripheral circuits 302 can be coupled with memory cell array 304 through bit lines BL(1) to BL(P), word lines WL(1) to WL(N), source lines SL, top select lines TSL, bottom select lines BSL, top dummy word lines TDWL, and bottom dummy word line BDWL, etc. Peripheral circuits 302 can include any suitable circuits for facilitating the operations of memory cell array 304 by applying and sensing voltage signals and/or current signals to and from memory cells 306 through bit lines BL(1) to BL(P), word lines WL(1) to WL(N), source lines SL, top select lines TSL, bottom select lines BSL, top dummy word lines TDWL, and bottom dummy word line BDWL. Peripheral circuits 302 can include various types of peripheral circuitry formed using complementary metal-oxide-semiconductor (CMOS) technologies. For example, FIG. 4 illustrates some example peripheral circuits 302 that may include a page buffer 404, a column decoder/bit line driver 406, a row decoder/word line driver 408, a voltage generator 410, control logic 412, cache/registers 414, an interface (I/F) 416, and a data bus 418. It can be apparent that in some examples, additional circuits may be included, such as a sensing amplifier.

Page buffer 404 can be configured to buffer data read from or programmed to memory cell array 402 according to control signals issued by control logic 412. In one example, page buffer 404 may store program data (write data) to be programmed into one page 310 (shown in FIG. 3) of memory cell array 304. In another example, page buffer 404 may also perform program verification operations to ensure that the data has been properly programmed into memory cells 306 coupled to a selected word line.

Row decoder/word line driver 408 can be configured to be controlled by control logic 412 to select a memory block 312 of memory cell array 304 and a word line WL of selected memory block 312. Row decoder/word line driver 408 can be further configured to drive memory cell array 402. For example, row decoder/word line driver 408 may drive memory cells 306 coupled to the selected word line using a voltage generated from voltage generator 410.

Column decoder/bit line driver 406 may be controlled by control logic 412 to select one or more NAND memory strings 308 (shown in FIG. 3) by applying a bit line voltage generated from voltage generator 410. For example, column decoder/bit line driver 406 may apply column signals for selecting a set of N bits of data from page buffer 404 to be output in a read operation.

Control logic 412 can be coupled to each peripheral circuit and configured to control operations of peripheral circuits 302 (shown in FIG. 3). Cache/registers 414 can be coupled to control logic 412 and may include status registers, command registers, and address registers for storing status information, command operation codes (OP codes), and command addresses for controlling the operations of each peripheral circuit.

Interface 416 can be coupled to control logic 412 and configured to interface memory cell array 402 with a memory controller (such as a memory controller 106 in FIG. 1). In some implementations, interface 416 may function as a control buffer to buffer and relay control commands received from memory controller 106 and/or a host (such as a host 102 in FIG. 1) to control logic 412 and status information received from control logic 412 to memory controller 106 and/or host 102. Interface 416 can also be coupled to page buffer 404 and column decoder/bit line driver 406 via data bus 418 and function as an I/O interface and a data buffer to buffer and relay the program data received from memory controller 106 and/or host 102 to page buffer 404 and the read data from page buffer 404 to memory controller 106 and/or host 102. In some implementations, interface 416 and data bus 418 can be parts of an I/O circuit of peripheral circuits 302.

Voltage generator 410 may be controlled by control logic 412 to generate word line voltages (e.g., read voltage, programming voltage, pass voltage, local voltage, and verification voltage) and bit line voltages to be supplied to memory cell array 402. In some implementations, voltage generator 410 can be part of a voltage source that provides voltages at various levels of different peripheral circuits 302 as described below in detail. Consistent with the scope of the present disclosure, in some implementations, the voltages provided by voltage generator 410, for example, to row decoder/word line driver 408, column decoder/bit line driver 406, and page buffer 404 may be above certain levels that can be sufficient to perform the memory operations. For example, the voltages provided to the page buffer circuits in page buffer 404 and/or the logic circuits in control logic 412 may be, e.g., between 1.3 V and 5 V (such as 3.3 V), and the voltages provided to the driving circuits in row decoder/word line driver 408 and/or column decoder/bit line driver 406 may be, e.g., between 5 V and 30 V.

Consistent with the scope of the present disclosure, voltage generator 410 may be further configured to generate different voltages supplied to, for example, word lines WL(1) to WL(N) (such as the programming voltage and the pass voltage), top select line TSL (such as the supply voltage), bottom select line BSL (such as the ground voltage), bit lines BLs, top dummy word line TDWL, and a bottom dummy word line BDWL, so as to achieve the desired purposes and functions as described below.

During the program operation, a programming voltage may be applied to a selected word line coupled to a target memory cell. The term "target memory cell" may be used to describe one or more main memory cells on which the program operations are performed. The programming voltage is applied to enable charges in the channel to travel through the tunnel layer and enter the charge trap layer, thus achieving the program operation on the target memory cell. Meanwhile, a pass voltage may be applied to unselected word lines. When applying a voltage to the gate of a transistor, it can also cause an increase in the potential of the channel between the source and drain terminals. This is due to capacitive coupling between the gate and channel, which creates an electric field that raises the channel potential. As a result, this induced voltage in the channel region of the target memory cell may boost the voltage applied to the channel region of the target memory cell. This phenomenon is called "self-boosting channel."

On the other hand, while the target memory cell is programmed, the pass voltage may also induce a voltage in the channel regions of the unselected memory cells through, e.g., capacitive coupling, which is referred to as "self-boosting voltage." The self-boosting voltage effect can be beneficial. This is because the induced voltage in the channel regions of the unselected memory cells can provide a voltage barrier that may prevent charge from leaking out of the unselected memory cells to the target memory cell. However, an excessive self-boosting voltage can also be a problem, as it can cause program disturbance in the neighboring memory cell. Therefore, it becomes an important consideration for controlling the level of the self-boosting voltage in the designs and operations of a memory device.

Figure 5:
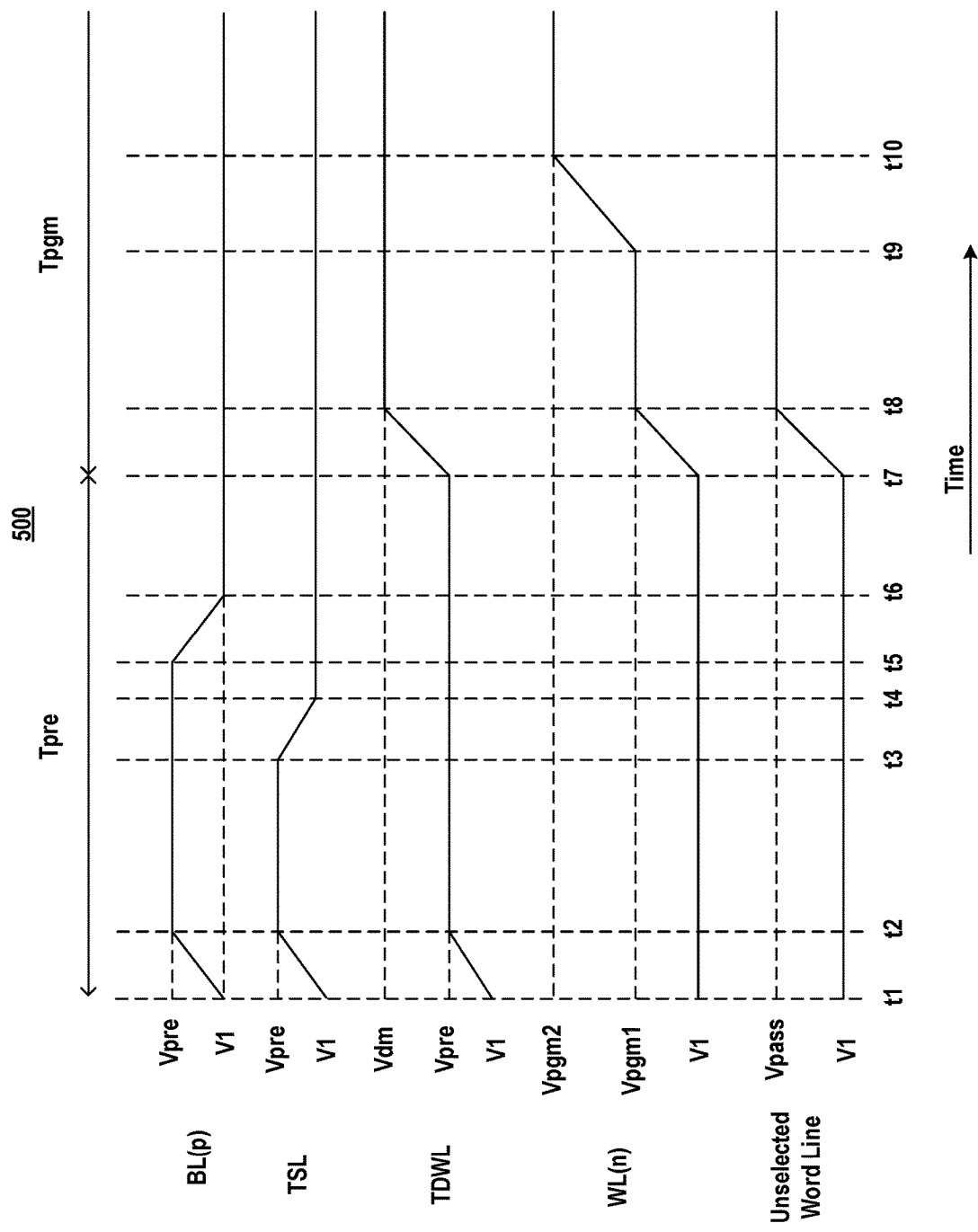
FIG. 5 illustrates a timing diagram showing an example voltage scheme in a program operation, according to some aspects of the present disclosure.

In view of the above, some program methods for reducing the program disturbance are presented in the present disclosure. FIG. 5 illustrates a timing diagram showing an example voltage scheme 500 in a program operation, according to some aspects of the present disclosure. With reference to FIG. 5, memory cell array 304 of a 3D structure in FIG. 3 is used as an example to describe how voltage scheme 500 may be applied to a memory device, although it is apparent that the proposed scheme may also be applied to other memory devices, such as a planar memory device. In FIG. 5, electrical lines as shown may include bit line BL(p), top select line TSL, top dummy word line TDWL, selected word line WL(n), and unselected word lines. As shown in FIG. 3, each of NAND memory strings 308 may be numbered as memory string S(1), memory string S(2) . . . , and memory string S(P), respectively, and BL(p) may be a bit line coupled to one of NAND memory strings 308. That is, p herein may be an integer between 1 and P (i.e., 1<p<P), and bit line BL(p) may be a selected bit line or an unselected bit line. In the example shown in FIG. 5, BL(p) includes a selected bit line. As shown in FIG. 3, word lines may include word lines WL(1) to WL(N), and n may be an integer between 1 and N (i.e., 1<n<N). The unselected word lines may include world lines other than selected word line WL(n). In this scenario, the unselected word lines include word lines WL(1) to WL(n−1) and word lines WL(n+1) to WL(n).

As shown in FIG. 5, the program operation may include a pre-pulse period Tpre and a program period Tpgm, and the per-pulse period Tpre may be performed before the program period Tpgm for a recovery process. From times t1 to t2, peripheral circuits 302 may drive bit line BL(p) (through, e.g., bit line driver 406), top select line TSL (through, e.g., word line driver 408), and top dummy word line TDWL (through, e.g., word line driver 408) from a voltage V1 (e.g., 0V) to a pre-pulse voltage Vpre, while holding selected word line WL(n) and the unselected word lines at voltage V1. Pre-pulse voltage Vpre may be higher than voltage V1. In one example, pre-pulse voltage Vpre can be 4V. Around time t2, the voltages on bit line BL(p), top select line TSL, and top dummy word line TDWL may reach pre-pulse voltage Vpre, thereby establishing, in this NAND memory string 308 corresponding to bit line BL(p), a channel of a top select transistor Cts(p) coupled to top select line TSL and a channel of a top dummy cell Ctd(p) coupled to top dummy word line TDWL. During times t2-t3, top select transistor Cts(p) and top dummy cell Ctd(p) in this NAND memory string 308 may remain on, thus producing a path of discharging electrons through top dummy cell Ctd(p) and top select transistor Cts(p) to bit line BL(p).

From times t3 to t4, peripheral circuits 302 may drive top select line TSL from pre-pulse voltage Vpre to voltage V1. Around time t4, the voltage on top select line TSL may reach voltage V1. As a result, top select transistor Cts(p) may be switched off, and electrons released from the channel of top select transistor Cts(p) may be discharged via bit line BL(p). From times t5 to t6, peripheral circuits 302 may drive bit line BL(p) from pre-pulse voltage Vpre to voltage V1. Around time t6, the voltage on bit line BL(p) may reach voltage V1, thereby stopping discharging the electrons.

As shown in FIG. 5, between times t3 and t7 before program period Tpgm, peripheral circuits 302 may maintain the voltage on top dummy word line TDWL at pre-pulse voltage Vpre, thus accumulating the electrons in the channel of top dummy cell Ctd(p).

Around time t7, the program operation may enter program period Tpgm. From times t7 to t8, peripheral circuits 302 may drive top dummy word line TDWL from pre-pulse voltage Vpre to a dummy voltage Vdm. In some examples, dummy voltage Vdm may be higher than pre-pulse voltage Vpre, as shown in FIG. 5. Meanwhile, the unselected word lines may be driven from voltage V1 to a pass voltage Vpass, and selected word line WL(n) may be driven from voltage V1 to a first programming voltage Vpgm1. In some implementations, each of dummy voltage Vdm and first programming voltage Vpgm1 may be substantially equal to pass voltage Vpass. From times t9 to t10, peripheral circuits 302 may further drive selected word line WL(n) from first programming voltage Vpgm1 to a second programming voltage Vpgm2. In some examples, second program pulse voltage Vpgm2 may be higher than first programming voltage Vpgm1. In FIG. 5, bit line BL(p) as shown can be a selected bit line, while bit line BL(p) can also be an unselected bit line, and accordingly, during program period Tpgm, a supply voltage Vsp may be applied to unselected bit line BL(p) for a program inhibition operation on memory cells 306 in a NAND memory string 308 coupled to unselected bit line BL(p). When bit line BL(p) is a selected bit line, and the voltage on bit line BL(p) may be maintained at voltage V1 (e.g., a ground voltage) during program period Tpgm to perform a program operation on main memory cells 306 in another NAND memory string 308, instead, as shown in FIG. 5.

In voltage scheme 500 of FIG. 5, after voltage V1 is applied to bit line BL(p) during pre-pulse period Tpre, top dummy word line TDWL may be maintained at voltage Vpre, thus accumulating the electrons in the channel of top dummy cell Ctd(p). In program period Tpgm after time t7, the electrons may be pulled out from the channel of top dummy cell Ctd(p) due to the increasing voltage on selected word line WL(n). The self-boosting voltage thus may be stepped down, leading to an inadvertent program on the unselected memory cells and thus resulting in program disturbance.

Figure 6:
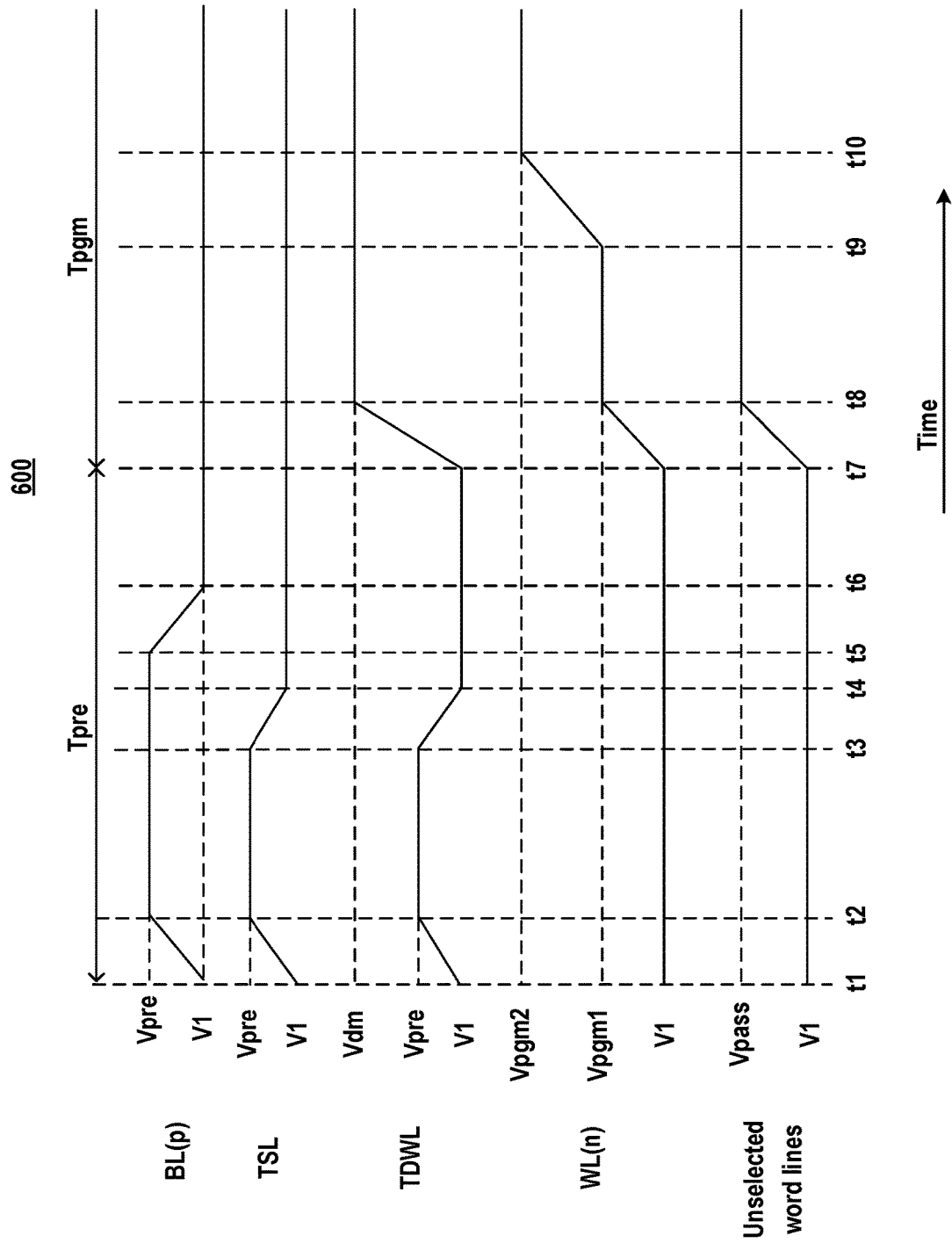
FIG. 6 illustrates a timing diagram showing another example voltage scheme in a program operation, according to some aspects of the present disclosure.

FIG. 6 illustrates a timing diagram showing another example voltage scheme 600 in a program operation, according to some aspects of the present disclosure. The program operation may include a pre-pulse period Tpre prior to a program period Tpgm. Between times t1 and t3 in pre-pulse period Tpre and times t7 and t10 in program period Tpgm, example voltage scheme 600 in FIG. 6 may be similar to voltage scheme 500 in FIG. 5. From times t3 to t4, peripheral circuits 302 may drive top select line TSL from pre-pulse voltage Vpre to voltage V1. At times t3 to t4 in voltage scheme 600 of FIG. 6, different from FIG. 5, peripheral circuits 302 may also drive top dummy word line TDWL from pre-pulse voltage Vpre to voltage V1. As a result, around time t4, the voltages on top select line TSL and top dummy word line TDWL may both reach voltage V1. Accordingly, in a NAND memory string 308 coupled to bit line BL(p), top select transistor Cts(p) and top dummy cell Ctd(p) may be both turned off. At times t5 to t6, the voltage on bit line BL(p) may be driven from pre-pulse voltage Vpre to voltage V1, as shown in FIG. 5. From times t4 to t7, peripheral circuits 302 may hold top dummy word line TDWL at voltage V1.

In some implementations, each of the threshold voltages of top select transistor Cts(p) and top dummy cell Ctd(p) may exceed the threshold voltage of main memory cells (in an erased state). Upon top select transistor Cts(p) and top dummy cell Ctd(p) being turned off, electrons from the channel of top dummy cell Ctd(p) may thus be transferred to main memory cells in this NAND memory string 308 rather than bit line BL(p). Although voltage V1 can be applied to top select line TSL and top dummy word line TDWL, at the same time, to turn off top select transistor Cts(p) and top dummy cell Ctd(p), a higher threshold voltage of top select transistor Cts(p) may cause it to turn off first, leading electrons trapped at the channel of top dummy cell Ctd(p). When top dummy cell Ctd(p) is subsequently turned off, the electrons may travel to the channels of the main memory cells in this NAND memory string 308. After time t7, owing to the electrons from top dummy cell Ctd(p), the self-boosting voltage may be reduced to a lower level, resulting in unintended program on a main memory cell of this NAND memory string 308.

Figure 8:
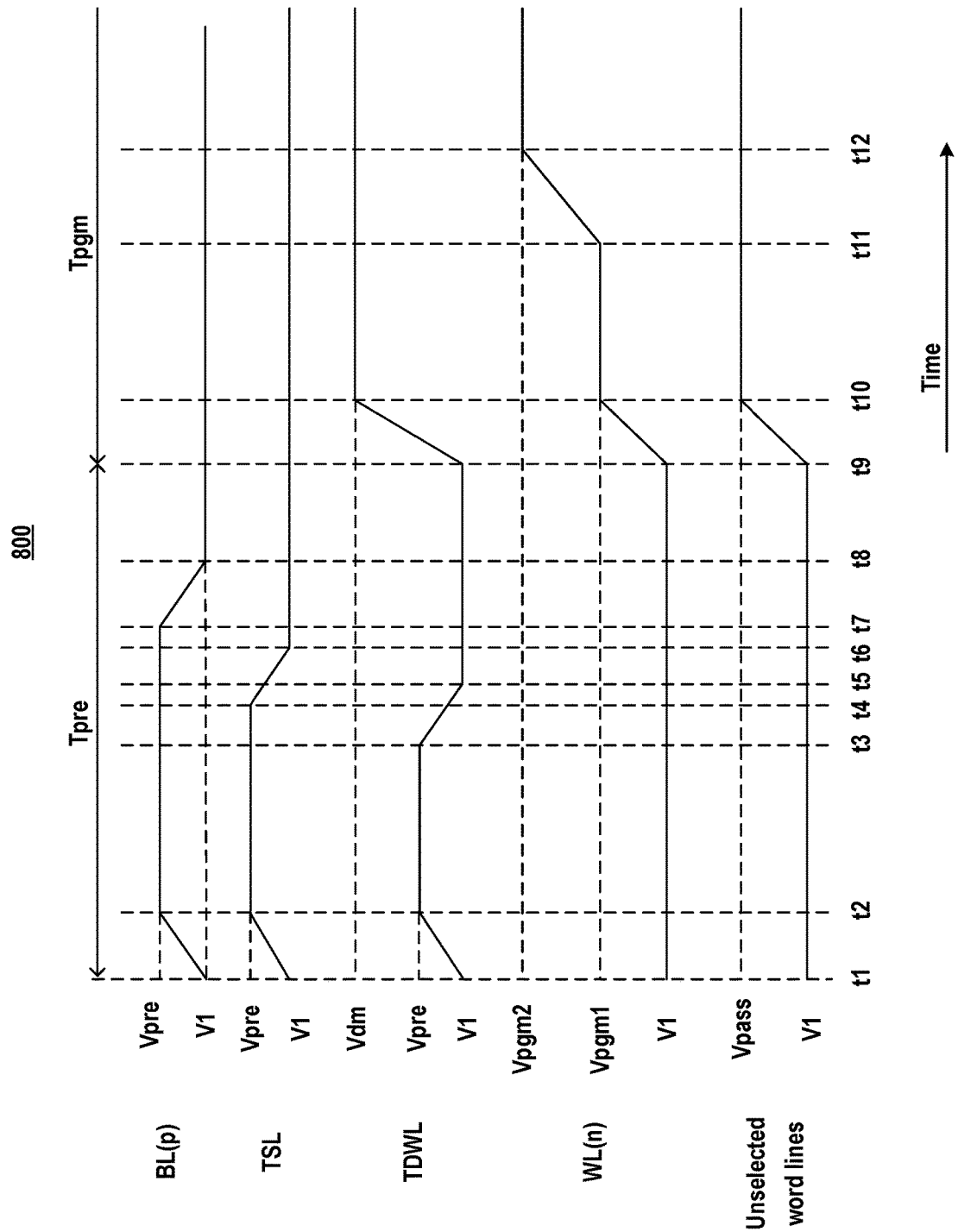
FIG. 8 illustrates a timing diagram showing still another example voltage scheme in a program operation, according to some aspects of the present disclosure.
Figure 9A:
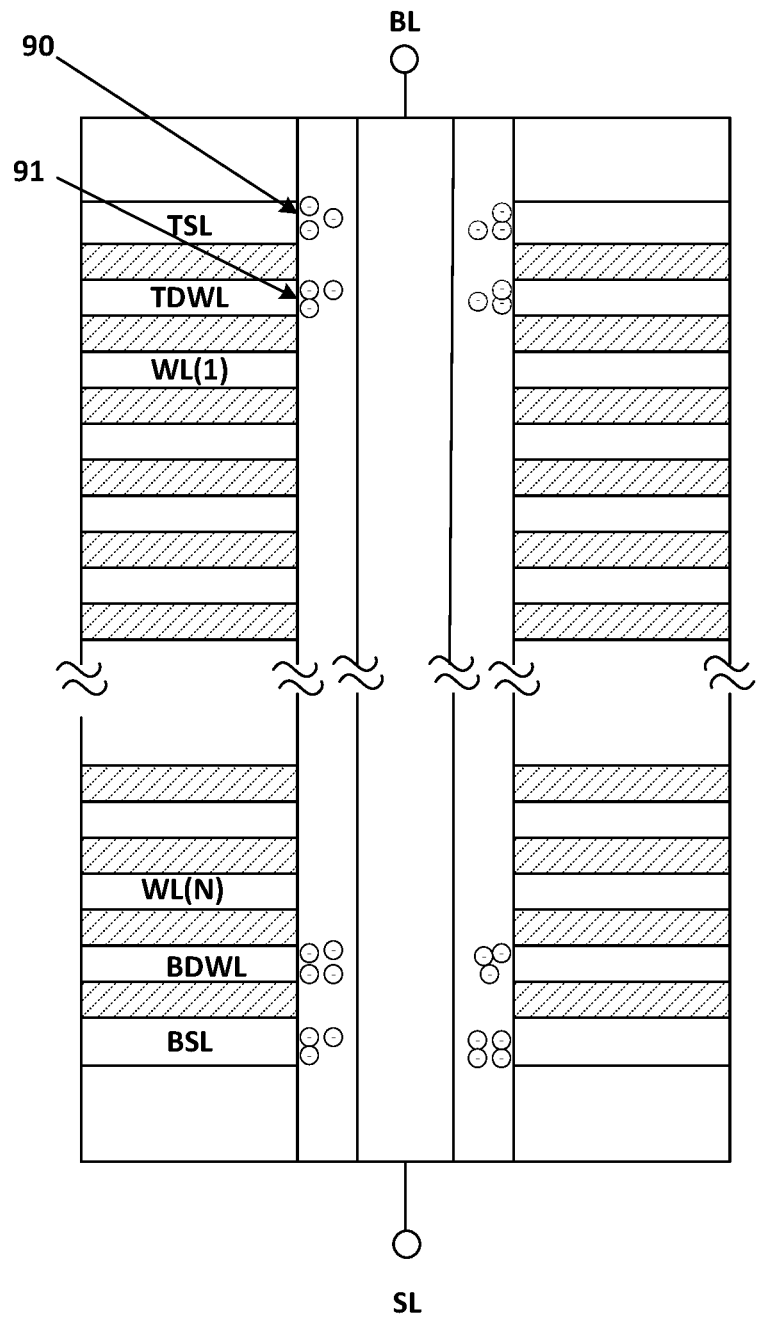
FIGS. 9A to 9C illustrate a schematic diagram showing electron migration and discharging, based on the method provided by FIG. 7, in a three-dimensional memory structure, according to some aspects of the present disclosure.
Figure 9B:
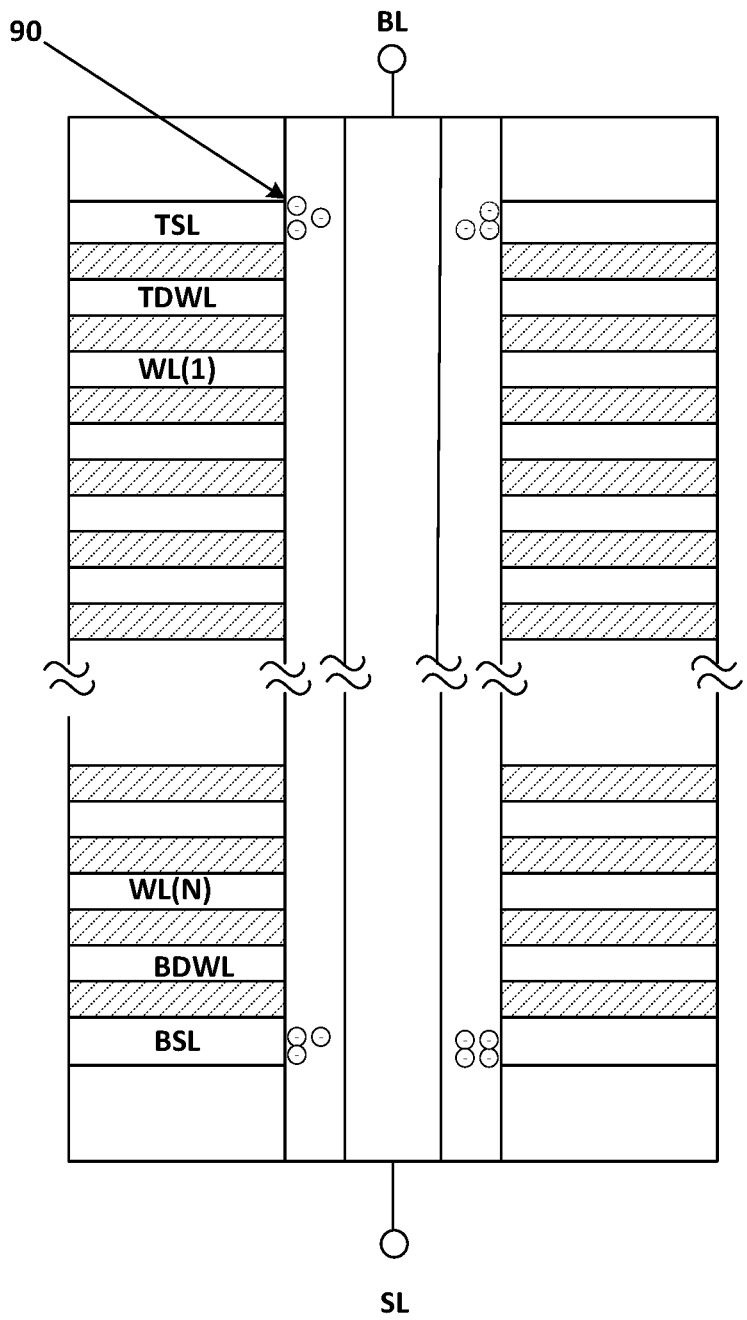
Figure 9C:
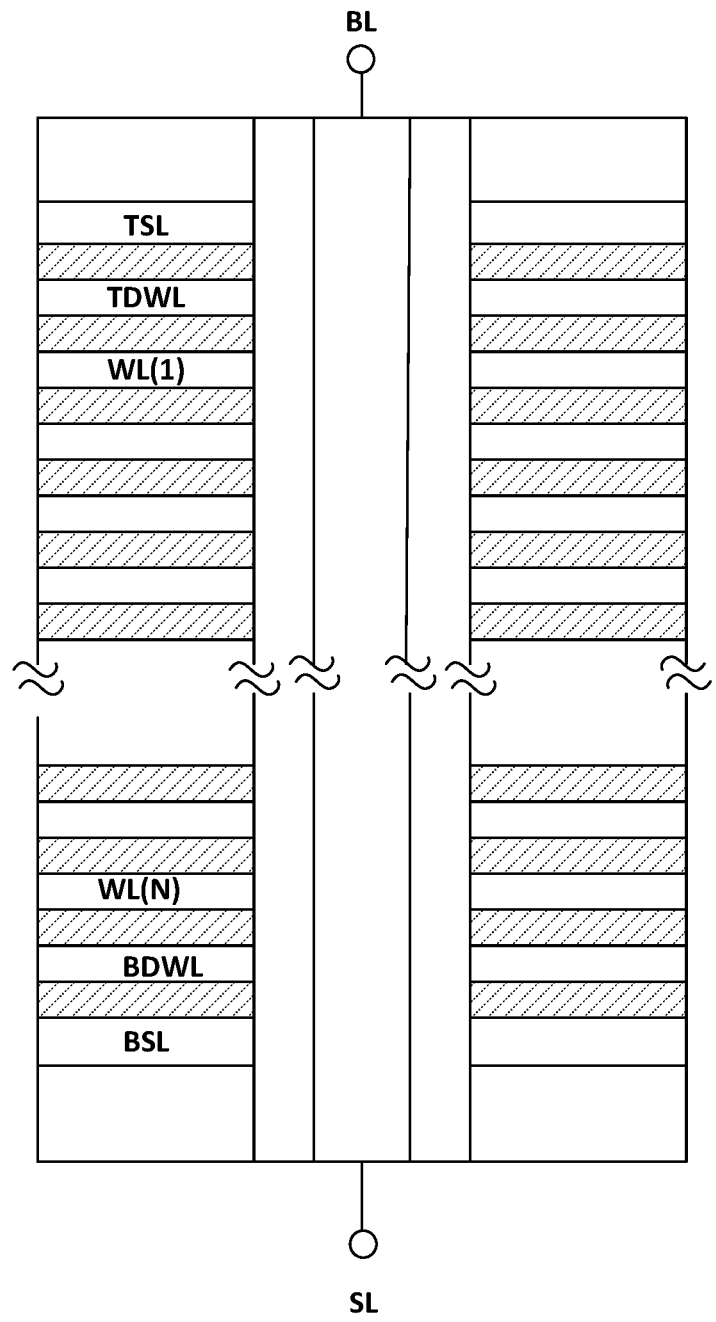

Therefore, another programming method is proposed in the present disclosure. FIG. 7 illustrates a flow chart of an example method 700 of programming a memory device, according to some aspects of the present disclosure. In some examples, the memory device may include a three-dimensional (3D) memory device, such as a three-dimensional NAND flash memory device, while in other examples, the memory device may include a planar memory device. FIG. 8 illustrates a timing diagram showing still another example voltage scheme 800 in a program operation, according to some aspects of the present disclosure. The program operation performed on the memory device may include a pre-pulse period Tpre and a program period Tpgm, and program period Tpgm may be before pre-pulse period Tpre, as shown in FIG. 8. FIGS. 9A to 9C illustrate a schematic diagram showing electron migration and discharging, based on method 700 provided by FIG. 7, in a three-dimensional memory structure, according to some aspects of the present disclosure. Method 700 is described below in reference to FIGS. 8-9C.

At 702, in pre-pulse period Tpre, peripheral circuits 302 may apply a first voltage on a top select line TSL to turn on a top select transistor Cts(p) in a NAND memory string 308 coupled to bit line BL(p) and a second voltage to a top dummy word line TDWL to turn on a top dummy cell Ctd(p) in this NAND memory string 308. Meanwhile, peripheral circuits 302 may apply a bit-line voltage to a bit line BL(p). In some implementations, the first voltage, the second voltage, and the bit-line voltage may be applied substantially at the same, i.e., in a parallel manner. Bit line BL(p) can be an unselected bit line or a selected bit line. To turn on top select transistor Cts(p) and top dummy cell Ctd(p), at times t1 to t2, peripheral circuits 302 (e.g., through bit line driver 406 and word line driver 408) may drive bit line BL(p), top select line TSL, and top dummy word line TDWL, respectively, from a low potential to a high potential. In some implementations, peripheral circuits 302 may drive each of bit line BL(p), top select line TSL, and top dummy word line TDWL from voltage V1 (e.g., 0V) to pre-pulse voltage Vpre (e.g., 4V) while holding selected word line WL(n) and the unselected word lines at voltage V1, as shown in FIG. 8.

In some examples, pre-pulse voltage Vpre may be higher than each of the threshold voltages of top select transistor Cts(p) and top dummy cell Ctd(p) to switch these cells on. In the example illustrated in FIG. 8, the first voltage may be substantially equal to the second voltage, and both of these voltages may be pre-pulse voltage Vpre. However, it can be understood that, in other examples, different voltages may be applied to top select line TSL and top dummy word line TDWL, respectively, to still turn on top select transistor Cts(p) and top dummy cell Ctd(p).

As shown in FIG. 8, around time t2, the voltages on bit line BL(p), top select line TSL, and top dummy word line TDWL may reach pre-pulse voltage Vpre, respectively, thereby establishing, in this NAND memory string 308 corresponding to bit line BL(p), a channel of top select transistor Cts(p) coupled to top select line TSL and a channel of top dummy cell Ctd(p) coupled to top dummy word line TDWL. As shown in FIG. 9A, as the voltages, applied to bit line BL(p), top select line TSL and top dummy word line TDWL, turn on top select transistor Cts(p) and top dummy cell Ctd(p), channels 90 and 91 may be induced around these cells, thus pulling electrons from memory cells 306 in this NAND memory string 308.

During times t2-t3 in FIG. 8, top select transistor Cts(p) and top dummy cell Ctd(p) in this NAND memory string 308 may remain on, thus maintaining the path of discharging electrons through top dummy cell Ctd(p) and top select transistor Cts(p). Through this manner, electrons may be extracted from memory cells Cm(p,1) to Cm(p,N) (in particular, from memory cell Cm(p,1)) and may be discharged through the discharging path through top dummy cell Ctd(p) and top select transistor Cts(p) into bit line BL(p).

Method 700 may proceed to 704. At 704, peripheral circuits 302 may apply a third voltage to top dummy word line TDWL to turn off top dummy cell Ctd(p) while top select transistor Cts(p) is still on. That is, top dummy cell Ctd(p) may be turned off before top select transistor Cts(p) is turned off. The third voltage may be a voltage lower than the threshold voltage of top dummy cell Ctd(p). For this purpose, in some implementations, a low potential may be applied to top dummy word line TDWL while each of bit line BL(p) and top select line TSL still holds a high potential. For example, from times t3 to t5, peripheral circuits 302 may drive top dummy word line TDWL from pre-pulse voltage Vpre (higher potential) to voltage V1 (lower potential), as shown in FIG. 8. Around time t5, the voltage of top dummy word line TDWL may reach voltage V1 and remain at voltage V1 (e.g., an off-state of top dummy cell Ctd(p)) until around time t9 when program period Tpre starts. In some examples, from times t3 to t4, the voltages of top select line TSL, and bit line BL(p) may remain at pre-pulse voltage Vpre.

As voltage V1 is applied to top dummy word line TDWL to turn off top dummy cell Ctd(p), channel 91, corresponding to top dummy cell Ctd(p), may be removed while channel 90 remains, thereby pulling electrons to be released from top dummy cell Ctd(p). More specifically, as top dummy cell Ctd(p) turns off, electrons from the channel of top dummy cell Ctd(p) (i.e., channel 91) flow to the channel of top select transistor Cts(p) (i.e., channel 90). When top select transistor Cts(p) is subsequently turned off, the electrons in channel 90 may further flow toward bit line BL. As a result, the electrons may be discharged, through channel 90, from top select transistor Cts(p) to bit line BL(p), as shown in FIG. 9B.

At 706 in FIG. 7, after the third voltage is applied to top dummy word line TDWL to turn off top dummy cell Ctd(p), peripheral circuits 302 may apply a fourth voltage to top select line TSL to turn off top select transistor Cts(p). That is, around a certain point, top dummy cell Ctd(p) and top select transistor Cts(p) may both be off. The fourth voltage may be a voltage lower than the threshold voltage of top dummy cell Ctd(p). For this purpose, in some implementations, a low potential may be applied to top select line TSL. For example, from times t4 to t6, peripheral circuits 302 may drive top select line TSL from pre-pulse voltage Vpre to voltage V1 while the voltage of bit line BL(p) remains at pre-pulse voltage Vpre, as shown in FIG. 8. In some examples, the first voltage may be substantially equal to the second voltage, and the third voltage may be substantially equal to the fourth voltage. It is apparent that, in other cases, the third voltage may be different from the fourth voltage, as the fourth voltage, different from the third voltage, may still turn off top select transistor Cts(p). Around time t6, the voltage of top select line TSL may reach voltage V1. When voltage V1 is applied to select line TSL while pre-pulse voltage Vpre is still applied to bit line BL(p), electrons released from top select transistor Cts(p) can be discharged into bit line BL(p).

Consistent with the scope of the present disclosure, top select transistor Cts(p) may be turned off after top dummy cell Ctd(p) is turned off. In some implementations, voltage V1 may be applied to top select transistor Cts(p) during the period when a voltage of top dummy cell Ctd(p) transits from pre-pulse voltage Vpre to voltage V1, e.g., from times t3 to t5 in FIG. 8. It can be understood that, in some implementations, voltage V1 may be applied to top select transistor Cts(p) after the voltage of top dummy cell Ctd(p) reaches voltage V1, e.g., after time t5. Consistent with the scope of the present disclosure, voltage V1 may be applied to bit line BL(p) after voltage V1 is applied to top select line TSL to turn off top select transistor Cts(p). In some implementations, voltage V1 may be applied to bit line BL(p)

during the period when a voltage of top select transistor Cts(p) transits from pre-pulse voltage Vpre to voltage V1, e.g., from times t4 to t6 in FIG. 8. It can also be understood that, in some implementations, voltage V1 may be applied to bit line BL(p) after the voltage of top select transistor Cts(p) reaches voltage V1, e.g., after time t6 in FIG. 8. The present disclosure does not limit thereto.

Method 700 may proceed to 708, where a fifth voltage may be applied to bit line BL(p) coupled to this NAND memory string 308. In some implementations, the fifth voltage may be a low potential, such as voltage V1. In some examples, from times t7 to t8, peripheral circuits 302 may drive bit line BP(p) from pre-pulse voltage Vpre to voltage V1. Around time t8, the voltage on bit line BL(p) may reach voltage V1, thereby completing the removal of the electrons from this NAND memory string 308 into bit line BL(p).

Method 700 may proceed to 710, where program period Tpgm of the program operation may be started. At 710, peripheral circuits 302 may apply one or more programming pulses to a selected word line WL(n), a pass voltage to unselected word lines (e.g., WL(1) to WL(n−1) and WL(n+1) to WL(N) in this scenario), and a dummy voltage Vdm to top dummy word line TDWL. Meanwhile, peripheral circuits 302 may apply a low potential, for example, voltage V1 (e.g., the ground voltage) to a selected bit line for the program operation on a target memory cell in a NAND memory string 308 coupled to the selected bit line (as shown in FIG. 8) and apply a supply voltage Vsp to an unselected bit line to inhibit programming memory cells in another NAND memory string 308 coupled to the unselected bit line.

In some implementations, from times t9 to t10, peripheral circuits 302 may drive selected word line WL(n) from voltage V1 to a first programming voltage Vpgm1, drive unselected word lines from voltage V1 to a pass voltage Vpass, and drive top dummy word line TDWL from voltage V1 to a dummy voltage Vdm. Dummy voltage Vdm applied to top dummy word line TDWL may be identical to or different from pass voltage Vpass. Around time t9, the voltage on selected word line WL(n) may reach first programming voltage Vpmg1.

Further, from times t11 to t12, peripheral circuits 302 may drive selected word line WL(n) from first programming voltage Vpgm1 to a second programming voltage Vpgm2, and around time t12, the voltage on selected word line WL(n) may reach second programming voltage Vpmg2. In some examples, second programming voltage Vpgm2 may be higher than first programming voltage Vpgm1. Consequently, the target memory cell may be programmed.

Through the voltage scheme described above, no electron or a very limited number of electrons may return to the memory cells in this NAND memory string 308 during the subsequent program operation. Based on this voltage scheme, a large number of electrons may be removed before the program operation. Consequently, the self-boosting voltage may step up, thereby suppressing program disturbance in the program operation and thus improving the data reliability.

It can be understood that although method 700 above is described with respect to a portion of a NAND memory string 308 in view of top dummy word line TDWL and top select line TSL, similar or same concepts may be applied to, e.g., bottom dummy word line BDWL and bottom select line BSL. Through the same or similar manners, unwanted electrons may be discharged into source line SL from corresponding bottom select transistors and bottom dummy cells coupled to bottom dummy word line BDWL and bottom select line BSL.

Figure 10A:
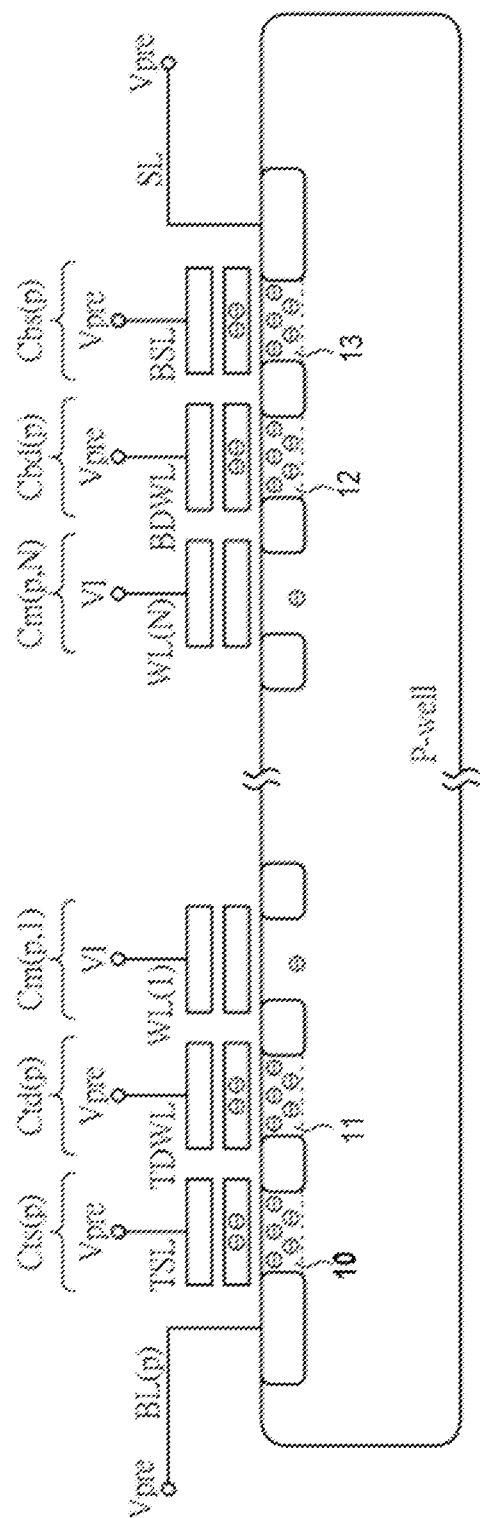
FIGS. 10A to 10C illustrate a schematic diagram showing electron migration and discharging, based on the method provided by FIG. 7, in a planar memory structure, according to some aspects of the present disclosure.
Figure 10B:
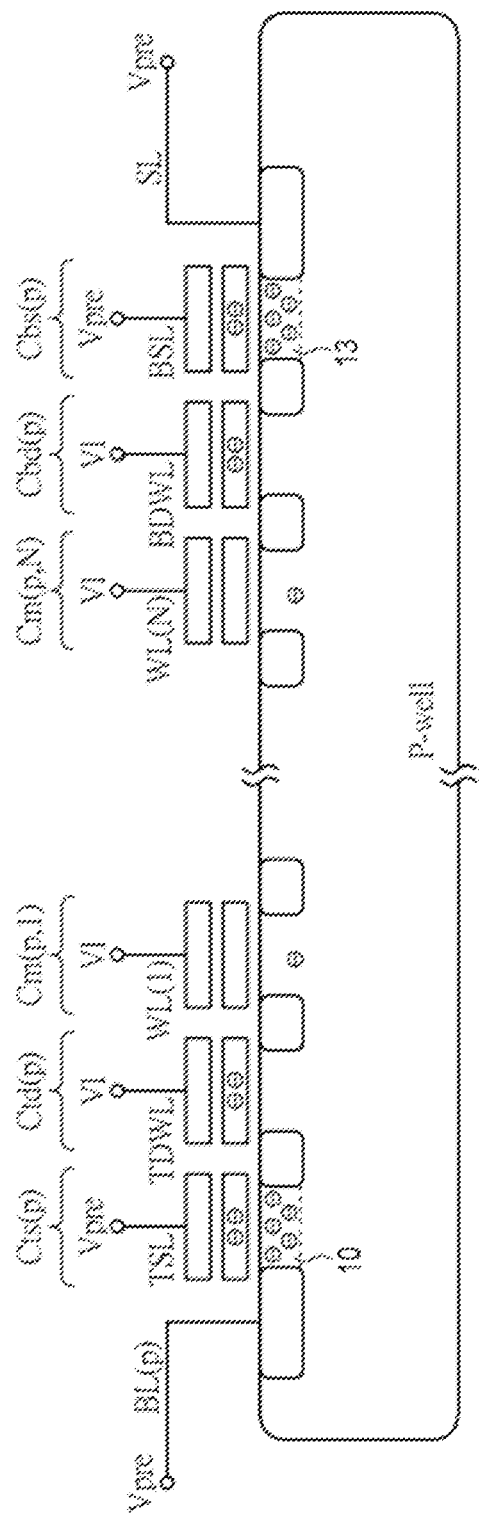
Figure 10C:
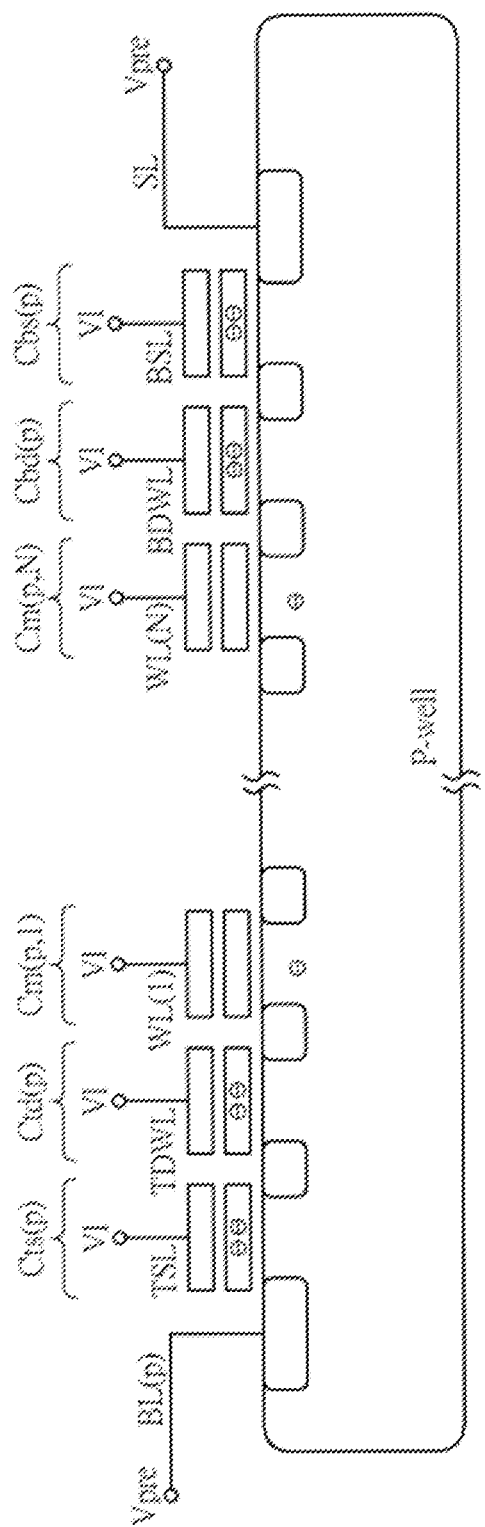

FIGS. 10A to 10C illustrate a schematic diagram showing electron migration and discharge, based on method 700 provided by FIG. 7, in a planar memory structure, according to some aspects of the present disclosure. As described above, method 700 may be applied to a 3D memory device or a planar memory device, and therefore, it can be understood that voltage scheme 800 provided in FIG. 8 may also be applied to a planar memory device to establish channels 10, 11, 12, and 13 corresponding to different memory cells in the planar memory device, as shown in FIG. 10A, thereby pulling electrons from memory cells and discharging them into bit lines or source lines. Subsequently, channels 11 and 12 may be removed by applying suitable voltages according to voltage scheme 800 to turn off cells corresponding to channels 11 and 12, as shown in FIG. 10B. Further, channels 10 and 13 may be removed, as shown in FIG. 10C, thereby discharging unwanted electrons into bit line BL and source line SL. Consequently, the program disturbance in the program operation may be suppressed, thus improving the data reliability.

Figure 11:
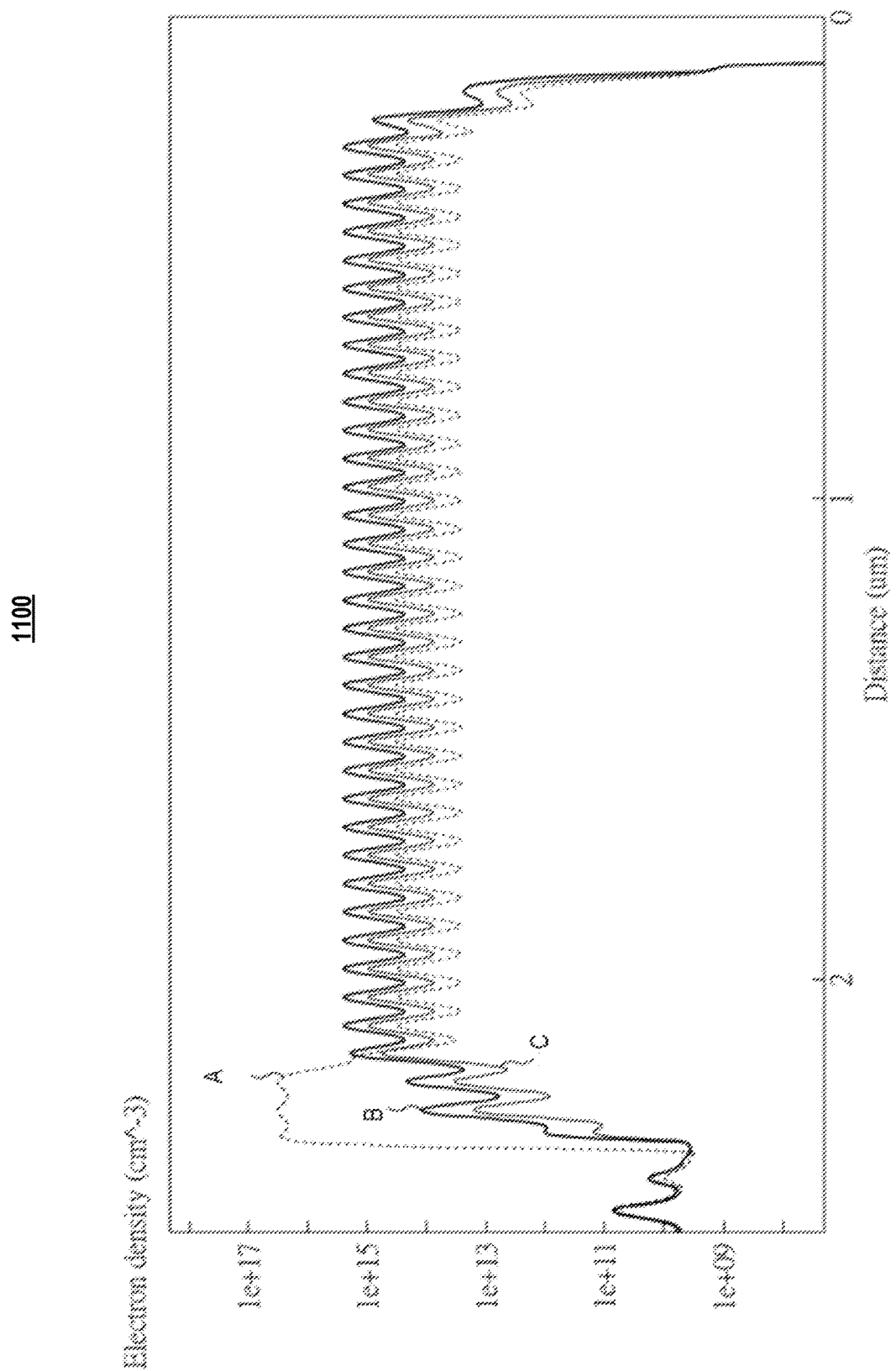
FIG. 11 illustrates a schematic diagram showing electron distributions, according to some aspects of the present disclosure.

FIG. 11 illustrates a schematic diagram showing electron distributions 1100, according to some aspects of the present disclosure. Curves A, B, and C correspond to voltage schemes 500, 600, and 800 provided in FIGS. 5, 6, and 8, respectively. In FIG. 11, the horizontal axis represents the distance from source line SL and the vertical axis represents an electron density. Electron distribution A shows that a significant quantity of electrons are accumulated in top select transistor Cts(p) and top dummy cell Ctd(p) according to voltage scheme 500 provided in FIG. 5, while electron distribution B shows that a smaller quantity of electrons is accumulated according to voltage scheme 600 provided in FIG. 6. By contrast, electron distribution C shows a reduced quantity of electrons according to voltage scheme 800 provided in FIG. 8 based on method 700 in FIG. 7.

Figure 12:
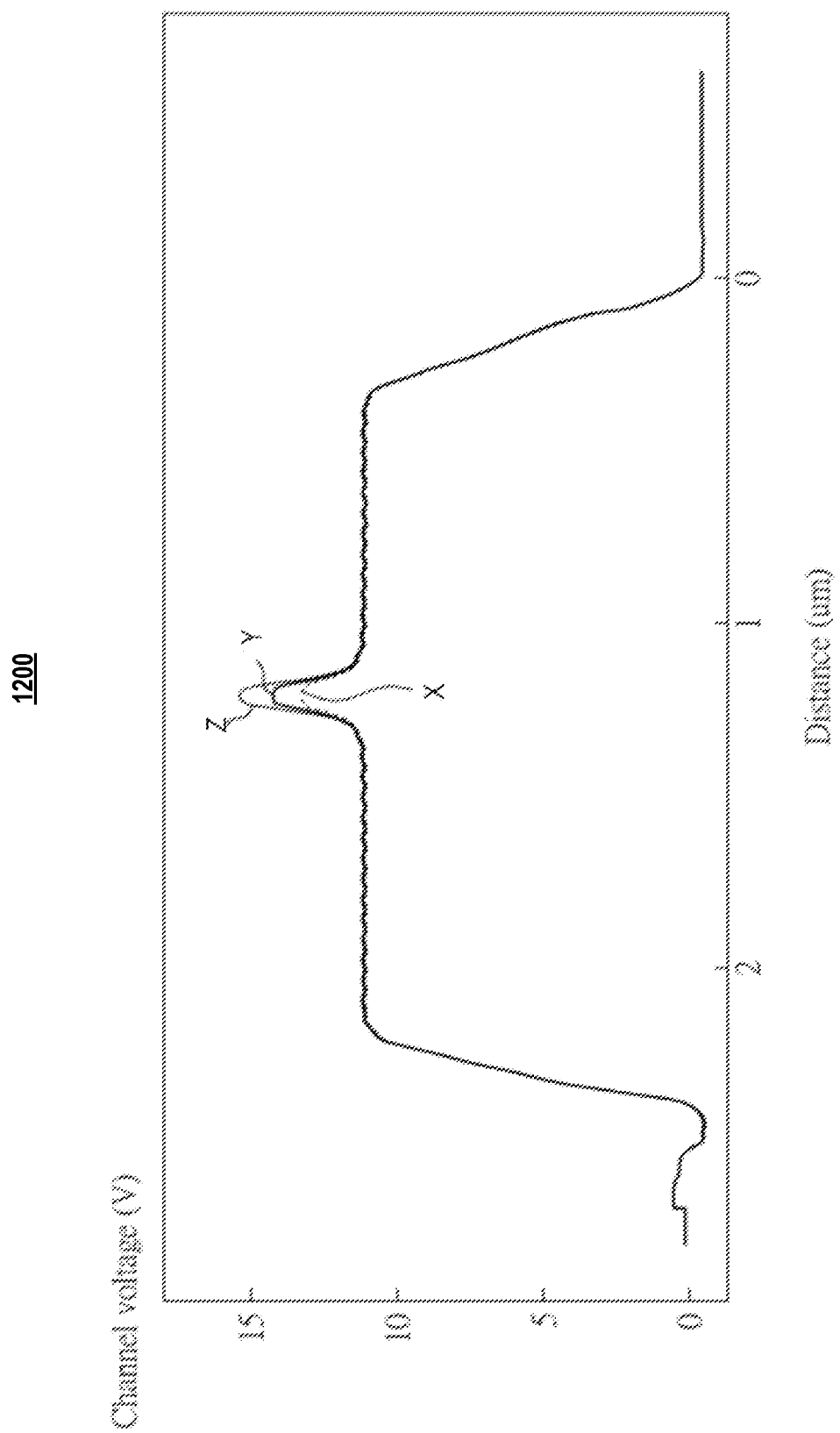
FIG. 12 illustrates a schematic diagram showing channel potential variations, according to some aspects of the present disclosure.

FIG. 12 illustrates a schematic diagram showing channel potential variations 1200, according to some aspects of the present disclosure. In FIG. 12, channel voltages X, Y, and Z correspond to voltage schemes 500, 600, and 800 provided in FIGS. 5, 6, and 8, respectively. The horizontal axis in FIG. 12 represents the distance from source line SL and the vertical axis represents a channel voltage. Compared with channel voltages X and Y according to voltage schemes 500 and 600, channel voltage Z according to voltage scheme 800 has the highest channel voltage, thereby effectively reducing the program disturbance occurring in a program operation.

FIG. 1 illustrates a block diagram of an example system 100 having a host 102 and a memory system 101, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include host 102 and memory system 101 having one or more memory devices 104 and a memory controller 106. Host 102 can be a processor of an electronic device, such as a central processing unit (CPU), or a system-on-chip (SoC), such as an application processor (AP). In some implementations, host 102 can be configured to send data to or receive data from memory device 104. In some implementations, host 102 can be a user logic, or a user interface such that the user may give instructions to host 102 and transmit the instructions to memory device 104 or the memory array.

Memory device 104 can be any memory device disclosed in the present disclosure. As disclosed below in detail, memory device 104, such as NAND Flash memory device, or dynamic random access memory (DRAM), phase-change random access memory (PCRAM) can include a clock input, a command bus, a data bus, a control logic, an address register, a row decoder/word line driver, a memory cell array having memory cells, a voltage generator, a page buffer/sense amplifier, a column decoder/bit line driver, a data input/output (I/O), according to some implementations.

Memory controller 106 may be coupled to memory device 104 and host 102 and may be configured to control memory device 104, according to some implementations. Memory controller 106 can manage the data stored in memory device 104 and communicate with host 102. In some implementations, memory controller 106 may be designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 may be designed for operating in a high duty-cycle environment solid-state drives (SSDs) or embedded multi-media-cards (eMMCs) used as data storage for mobile devices, such as smartphones, tablets, laptop computers, etc., and enterprise storage arrays.

Memory controller 106 can be configured to control operations of memory device 104, such as read, erase, and write operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 may be further configured to process error correction codes (ECCs) with respect to the data read from or written to memory device 104. Memory controller 106 may perform any other suitable functions as well, for example, formatting memory device 104. Memory controller 106 can communicate with an external device (e.g., host 102) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc. Furthermore, memory controller 106 can also be configured to receive a command from, transmit data to host 102, and perform multiple functions according to some implementations of the present disclosure.

Figure 2A:
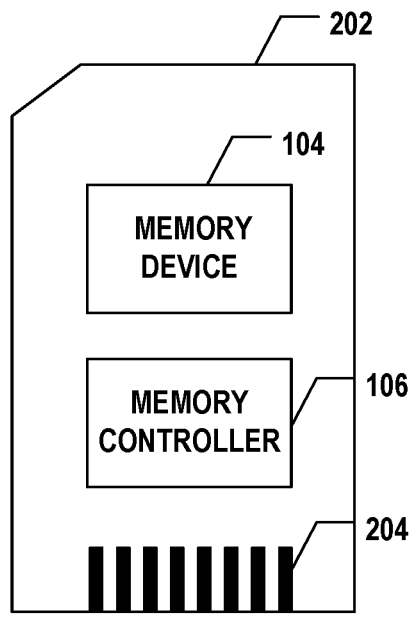
FIG. 2A illustrates a diagram of an example memory card having a memory device, according to some aspects of the present disclosure.
Figure 2B:
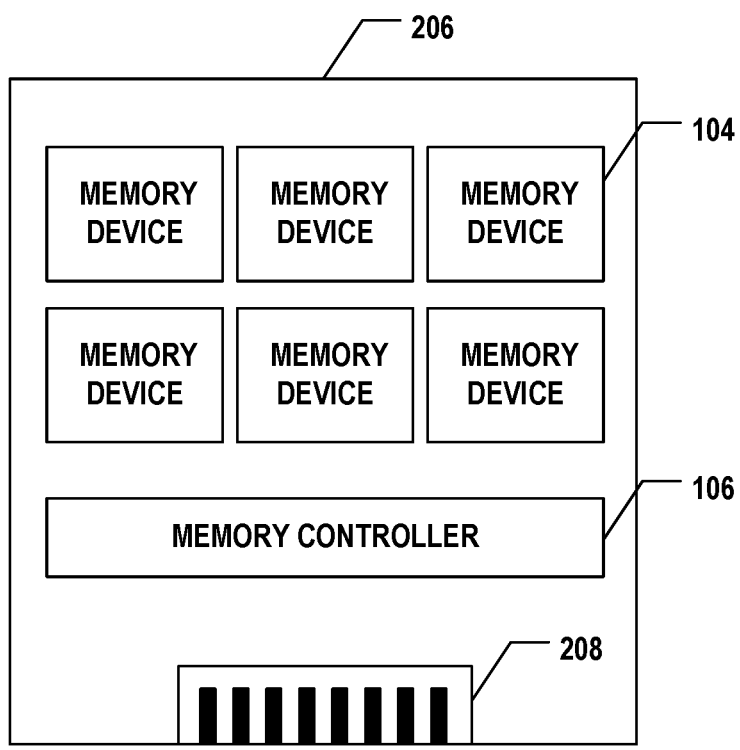
FIG. 2B illustrates a diagram of an example solid-state drive (SSD) having a plurality of memory devices, according to some aspects of the present disclosure.

Memory controller 106 and one or more memory devices 104 can be integrated into various types of storage devices, for example, being included in the same package, such as a universal Flash storage (UFS) package or an eMMC package. That is, memory system 101 can be implemented and packaged into different types of end electronic products. In one example as shown in FIG. 2A, memory controller 106 and a single memory device 104 may be integrated into a memory card 202. Memory card 202 can include a PC card (personal computer memory card international association, PCMCIA), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 102 in FIG. 1). In another example as shown in FIG. 2B, memory controller 106, and multiple memory devices 104 may be integrated into an SSD 206. SSD 206 can further include an SSD connector 208 coupling SSD 206 with a host (e.g., host 102 in FIG. 1). In some implementations, the storage capacity and/or the operation speed of SSD 206 can be greater than those of memory card 202.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described example implementations, but should be defined only in accordance with the following claims and their equivalents.

What is claimed is:

1. A memory device, comprising:
a plurality of memory strings, one of the memory strings comprising memory cells, a select transistor coupled to a select line and a bit line, and a dummy cell coupled to a dummy word line and arranged between the select transistor and the memory cells; and
a peripheral circuit coupled to the memory strings and configured to, in a pre-pulse period of a program operation:
maintain a first voltage on the select line to retain an on-state of the select transistor and apply a second voltage to the dummy word line to turn off the dummy cell;
before applying the second voltage to the dummy word line to turn off the dummy cell, apply a sixth voltage to the dummy word line to turn on the dummy cell; and
after applying the second voltage to the dummy word line, apply a third voltage to the select line to turn off the select transistor.

2. The memory device of claim 1, wherein:
the second voltage is substantially equal to the third voltage.

3. The memory device of claim 1, wherein:
the first voltage is higher than each of the second voltage and the third voltage.

4. The memory device of claim 1, wherein:
the peripheral circuit is further configured to maintain a fourth voltage on the bit line during the on-state of the select transistor, the fourth voltage being higher than each of the second voltage and the third voltage.

5. The memory device of claim 4, wherein:
the peripheral circuit is configured to, in the pre-pulse period after applying the third voltage to the select line to turn off the select transistor, apply a fifth voltage to the bit line, the fifth voltage being lower than the fourth voltage.

6. The memory device of claim 5, wherein:
the bit line is an unselected bit line.

7. The memory device of claim 1, wherein:
the peripheral circuit is configured to, before applying the second voltage to the dummy word line, apply a fourth voltage to the bit line and the first voltage to the select line to turn on the select transistor.

8. The memory device of claim 7, wherein:
the fourth voltage, the first voltage, and the sixth voltage are substantially identical.

9. The memory device of claim 1, wherein:
the peripheral circuit is configured to, after applying the second voltage to the dummy word line, hold the second voltage on the dummy word line to retain an off-state of the dummy cell before a program period of the program operation.

10. The memory device of claim 1, wherein:
each of the memory cells is coupled to a word line; and
in a program period of the program operation, the peripheral circuit is configured to apply a programming voltage to a selected word line from the word lines, and apply a pass voltage to an unselected word line other than the selected word line, the selected word line being coupled to a target memory cell, and the programming voltage being higher than the pass voltage.

11. The memory device of claim 10, wherein:
the program period is after the pre-pulse period.

12. The memory device of claim 10, wherein:
in the program period before applying the programming voltage to the selected word line, the peripheral circuit is further configured to apply the pass voltage to the selected word line.

13. The memory device of claim 10, wherein:
The peripheral circuit is configured to, in the program period, apply a dummy voltage to the dummy word line, the dummy voltage being higher than the second voltage.

14. The memory device of claim 10, wherein:
the peripheral circuit is configured to, in the program period, apply a supply voltage to the bit line for program inhibition.

15. The memory device of claim 10, wherein:
the peripheral circuit is configured to, in the program period, apply a ground voltage to the bit line of the program operation.

16. A memory device, comprising:
a plurality of memory strings, one of the memory strings comprising memory cells, a select transistor coupled to a bit line and a select line, and a dummy cell coupled to a dummy word line and arranged between the select transistor and the memory cells; and
a peripheral circuit coupled to the memory strings and configured to, before programming a target memory cell of the memory cells:
apply a first voltage to the select line to turn on the select transistor, and a second voltage to the dummy word line to turn on the dummy cell; and
after applying a third voltage to the dummy word line to turn off the dummy cell, apply a fourth voltage to the select line to turn off the select transistor, the third voltage being applied after the second voltage,
wherein:
the third voltage is lower than the second voltage; and
the fourth voltage is lower than the first voltage.

17. The memory device of claim 16, wherein before programming the target memory cell, the peripheral circuit is further configured to:
maintain a fifth voltage on the bit line before the fourth voltage is applied to the select line; and
after the fourth voltage is applied to the select line, apply a sixth voltage to the bit line, the sixth voltage being lower than the fifth voltage.

18. The memory device of claim 16, wherein:
the first voltage is substantially equal to the second voltage; and
the third voltage is substantially equal to the fourth voltage.

19. The memory device of claim 16, wherein:
the first voltage to the select line and the second voltage to the dummy word line are applied in a parallel manner.

20. A method of operating a memory device, wherein:
the memory device comprises a plurality of memory strings, one of the memory strings comprising memory cells, a select transistor coupled to a bit line and a select line, and a dummy cell coupled to a dummy word line and arranged between the select transistor and the memory cells; and
the method comprises:
applying a first voltage to the select line to turn on the select transistor, and a second voltage to the dummy word line to turn on the dummy cell; and
after applying a third voltage to the dummy word line to turn off the dummy cell, applying a fourth voltage to the select line to turn off the select transistor, comprising starting to apply the third voltage to the dummy word line while the first voltage is still being applied to the select line, the third voltage being lower than the second voltage, and the fourth voltage being lower than the first voltage.

* * * * *